United States Patent
Shimura et al.

(10) Patent No.: US 7,531,036 B2
(45) Date of Patent: *May 12, 2009

(54) SINGLE CRYSTAL HEAT TREATMENT METHOD

(75) Inventors: Naoaki Shimura, Hitachinaka (JP); Yasushi Kurata, Hitachinaka (JP); Tatsuya Usui, Hitachinaka (JP); Kazuhisa Kurashige, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 80 days.

This patent is subject to a terminal disclaimer.

(21) Appl. No.: 11/374,435

(22) Filed: Mar. 14, 2006

(65) Prior Publication Data

US 2006/0266276 A1 Nov. 30, 2006

(30) Foreign Application Priority Data

May 27, 2005 (JP) ............................ P2005-155874
Sep. 1, 2005 (JP) ............................ P2005-253885

(51) Int. Cl.
*C30B 15/14* (2006.01)
*C30B 21/06* (2006.01)

(52) U.S. Cl. .............................. 117/3; 117/11; 117/13; 117/906; 117/944

(58) Field of Classification Search ...................... 117/3, 117/11, 13, 906, 944

See application file for complete search history.

(56) References Cited

U.S. PATENT DOCUMENTS 4,883,956 A * 11/1989 Melcher et al. .......... 250/269.2

(Continued)

FOREIGN PATENT DOCUMENTS

JP 7-78215 B2 8/1995

(Continued)

OTHER PUBLICATIONS

Second English Abstract copy for JP 2701577B2 reference from the IDS cited reference on May 5, 2006.*

(Continued)

*Primary Examiner*—Robert M Kunemund
*Assistant Examiner*—G. Nagesh Rao
(74) *Attorney, Agent, or Firm*—Westerman, Hattori, Daniels & Adrian, LLP.

(57) ABSTRACT

The present invention provides a single crystal heat treatment method, having a step of heating a single crystal of a cerium-doped silicate compound represented by any of general formulas (1) to (4) below in an oxygen-containing atmosphere $$Y_{2-(x+y)}Ln_xCe_ySiO_5 \quad (1)$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \quad (2)$$

(wherein Ln represents at least one elemental species selected from a group consisting of elements belonging to the rare earth elements, z represents a numerical value greater than 0 but less than or equal to 2, and w represents a numerical value greater than 0 but less than or equal to 0.2)

$$Gd_{2-(p+q)}Ln_pCe_qSiO_5 \quad (3)$$

(wherein Ln represents at least one elemental species selected from a group consisting of Dy, Ho, Er, Tm, Yb, Lu, Y and Sc, which are rare earth elements having an ionic radius smaller than Tb, p represents a numerical value greater than 0 but less than or equal to 2, and q represents a numerical value greater than 0 but less than or equal to 0.2)

$$Gd_{2-(r+s)}Lu_rCe_sSiO_5 \quad (4)$$

(wherein r represents a numerical value greater than 0 but less than or equal to 2, and s represents a numerical value greater than 0 but less than or equal to 0.2).

14 Claims, 1 Drawing Sheet

U.S. PATENT DOCUMENTS

| | | | |
|---|---|---|---|
| 4,958,080 A | 9/1990 | Melcher | |
| 5,025,151 A * | 6/1991 | Melcher | 250/269.6 |
| 5,264,154 A | 11/1993 | Akiyama et al. | |
| 5,660,627 A * | 8/1997 | Manente et al. | 117/12 |
| 6,278,832 B1 * | 8/2001 | Zagumennyi et al. | 385/141 |
| 6,323,489 B1 * | 11/2001 | McClellan | 250/361 R |
| 7,151,261 B2 * | 12/2006 | Chai | 250/362 |
| 7,166,845 B1 * | 1/2007 | Chai | 250/361 R |
| 2005/0253072 A1 * | 11/2005 | Chai | 250/361 R |
| 2006/0011845 A1 * | 1/2006 | Chai et al. | 250/361 R |
| 2006/0108565 A1 * | 5/2006 | Wakamatsu et al. | 252/301.4 H |
| 2006/0266276 A1 * | 11/2006 | Shimura et al. | 117/19 |
| 2006/0266277 A1 * | 11/2006 | Usui et al. | 117/19 |
| 2006/0288926 A1 * | 12/2006 | Kurata et al. | 117/16 |
| 2007/0246660 A1 * | 10/2007 | Tahon et al. | 250/483.1 |
| 2007/0246662 A1 * | 10/2007 | Tahon et al. | 250/484.4 |
| 2007/0246663 A1 * | 10/2007 | Tahon et al. | 250/484.4 |
| 2007/0272867 A1 * | 11/2007 | Tahon et al. | 250/361 R |

FOREIGN PATENT DOCUMENTS

| | | |
|---|---|---|
| JP | 2701577 B2 | 10/1997 |
| JP | 2852944 B2 | 11/1998 |

OTHER PUBLICATIONS

English translation of JP 2003-300795 Hitachi Chem Co. Ltd.*

* cited by examiner

SINGLE CRYSTAL HEAT TREATMENT METHOD

BACKGROUND OF THE INVENTION

1. Field of the Invention

The present invention relates to a single crystal heat treatment method; and more specifically, it relates to a heat treatment method for a single crystal used in a single crystal scintillation detector (scintillator) for detecting radiation such as gamma radiation and the like in fields such as radiology, physics, physiology, chemistry, mineralogy, and oil exploration, including medical diagnostic positron CT (PET) scanning, observation of cosmic rays, and exploration for underground resources.

2. Related Background of the Invention

Because scintillators that use cerium-doped gadolinium orthosilicate compounds have a short fluorescent decay time and also a large radiation absorption coefficient, they have found applications as radiation detectors for positron CT and the like. The light output of these scintillators is greater than that of BGO scintillators, but only about 20% of the light output of NaI (Tl) scintillators, and further improvement is needed in that area.

Recently, scintillators using single crystals of cerium-doped lutetium orthosilicate, which are generally represented by the formula $LU_{2(1-x)}Ce_{2x}SiO_5$, have been disclosed (Japanese Patent Registration No. 2852944, and U.S. Pat. No. 4,958,080). In addition, scintillators using single crystals of the compound represented by the general formula $Gd_{2-(x+y)}Ln_xCe_ySiO_5$ (wherein Ln represents Lu or a species of rare earth element) have been disclosed (see Japanese Patent Application Laid-open No. 7-78215 and U.S. Pat. No. 5,264,154). It is known that in these scintillators not only is the crystal density increased, but also the light output of cerium-doped orthosilicate single compounds crystals is increased, and the fluorescent decay time can be shortened.

Furthermore, Japanese Patent Registration No. 2701577 discloses a heat treatment method that increases scintillator properties such as light output and energy resolution capability and the like of single crystals of cerium-doped gadolinium orthosilicate compounds. This heat treatment method is one wherein a heat treatment is performed in an oxygen-poor atmosphere at a high temperature (a temperature ranging from 50° C. to 550° C. lower than the melting point of the single crystal). According to this document, scintillation properties are increased by an effect wherein tetravalent cerium ions, which are an impediment to scintillation luminescence, are reduced to a trivalent state.

SUMMARY OF THE INVENTION

However, the single crystals of cerium-doped orthosilicate compounds disclosed in the above document tend to have a high light output background. This results in problems such as variation in fluorescent properties both within and between crystal ingots; in other words, day-to-day variations and time-course changes due to exposure to natural light, including ultraviolet light, occur frequently, and it is very difficult to obtain stable light output properties.

In addition, among the single crystals of cerium-doped silicate compounds, it has become clear that when single crystals of the cerium-doped silicate compounds represented by general formulas (1), (2), and (4) below are grown or cooled in an oxygen-poor atmosphere, or heated at high temperatures in an oxygen-poor atmosphere after single crystal growth, the light output background rises, and there is a greater drop-off in light output and greater variation in fluorescent properties.

$$Y_{2-(x+y)}Ln_xCe_ySiO_5 \tag{1}$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \tag{2}$$

(wherein Ln represents at least one elemental species selected from a group consisting of elements belonging to the rare earth elements, z represents a numerical value greater than 0 but less than or equal to 2, L and w represents a numerical value greater than 0 but less than or equal to 0.2)

$$Gd_{2-(r+s)}Lu_rCe_sSiO_5 \tag{4}$$

(wherein r represents a numerical value greater than 0 but less than or equal to 2, and s represents a numerical value greater than 0 but less than or equal to 0.2)

This tendency becomes particularly pronounced with a single crystal having as Ln at least one elemental species selected from a group consisting of Dy, Ho, Er, Tm, Yb, Lu, Y and Sc, which have an ionic radius smaller than Tb.

Moreover, satisfactory results can be obtained with the heat treatment method disclosed in Japanese Patent Registration No. 2701577 when it is used on a single crystal of $Gd_{2(1-x)}Ce_{2x}SiO_5$ (cerium-doped gadolinium orthosilicate). However, when this heat treatment is used with single crystals of the cerium-doped silicate compounds represented by general formula (1) above or with single crystals of the cerium-doped gadolinium silicates compounds represented by general formulas (2) and (4) above, the light output background increases. As a result, it has been learned that this heat treatment results in negative effects of a greater drop-off in light output and greater variation in light output. This tendency becomes particularly pronounced with a single crystal having as Ln at least one elemental species selected from a group consisting of Dy, Ho, Er, Tm, Yb, Lu, Y and Sc, which have an ionic radius smaller than Tb.

Furthermore, there is a method wherein specific cerium-doped silicate single crystals are grown or cooled in an oxygen-containing atmosphere (for example, an atmosphere wherein the oxygen concentration is 0.2 vol % or higher), and then a high-temperature heat treatment is performed on those single crystals in an oxygen-containing atmosphere; however, it has become clear that such a method brings about a drop-off in light output due to coloration of the crystal, absorption of fluorescent and the like.

Thus, upon taking into account the above circumstances, an object of the present invention is to provide a single crystal heat treatment method wherein excellent fluorescent properties are obtained even in single crystals of the cerium-doped silicate compounds represented by general formulas (1), (2), and (4) above, and especially in single crystals having at least one elemental species selected from a group consisting of Dy, Ho, Er, Tm, Yb, Lu, Y and Sc, which have an ionic radius smaller than Tb, as Ln.

The present invention provides a single crystal heat treatment method having a step wherein a single crystal of a cerium-doped silicate compound represented by general formula (1) or (2) below is heated in an oxygen-containing atmosphere $$Y_{2-(x+y)}Ln_xCe_ySiO_5 \tag{1}$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \quad (2)$$

(wherein Ln represents at least one elemental species selected from a group consisting of elements belonging to the rare earth elements, z represents a numerical value greater than 0 but less than or equal to 2, and w represents a numerical value greater than 0 but less than or equal to 0.2).

The present invention provides a single crystal heat treatment method having a step wherein a single crystal of a cerium-doped silicate compound represented by general formula (3) below is heated in an oxygen-containing atmosphere $$Gd_{2-(p+q)}Ln_pCe_qSiO_5 \quad (3)$$

(wherein Ln represents at least one elemental species selected from a group consisting of Dy, Ho, Er, Tm, Yb, Lu, Y and Sc, which are rare earth elements having an ionic radius smaller than Tb, p represents a numerical value greater than 0 but less than or equal to 2, and q represents a numerical value greater than 0 but less than or equal to 0.2).

The present invention provides a single crystal heat treatment method having a step wherein a single crystal of a cerium-doped silicate compound represented by general formula (4) below is heated in an oxygen-containing atmosphere $$Gd_{2-(r+s)}Lu_rCe_sSiO_5 \quad (4)$$

(wherein r represents a numerical value greater than 0 but less than or equal to 2, and s represents a numerical value greater than 0 but less than or equal to 0.2).

The present invention provides a single crystal heat treatment method wherein the oxygen-containing atmosphere is an atmosphere that has an oxygen concentration of 100 vol %, or an atmosphere that contains nitrogen or an inert gas and has an oxygen concentration of 1 vol % or higher but less than 100 vol %.

The present invention provides a single crystal heat treatment method wherein the single crystal is heated at a temperature ranging from 300° C. to 1150° C. in the heating step.

The present invention provides a single crystal heat treatment method wherein the heating temperature ranges from 700° C. to 1150° C. in the heating step.

The present invention provides a single crystal heat treatment method wherein the single crystal of the cerium-doped silicate compound contains 0.00005 to 0.1 wt %, with respect to the total weight of the single crystal, of at least one elemental species selected from a group consisting of Mg, Ca, Sr, Ti, Zr, Hf, V, Nb, Ta, Cr, Mo and W, and the single crystal is heated at a temperature of 700° C. to 1300° C. in the heating step.

The present invention provides a single crystal heat treatment method wherein the heating step has a first step wherein the single crystal is heated at a temperature of 300° C. to 1150° C. in the oxygen-containing atmosphere; a second step wherein, subsequent to the first step, the atmosphere is converted to an oxygen-poor atmosphere while the heating temperature is maintained; and a third step wherein, subsequent to the second step, the single crystal is heated at a temperature $T_a$ (units: ° C.), which is higher than the heating temperature and satisfies the conditions represented by formula (5) below, in the oxygen-poor atmosphere $$500 \leq T_a < (T_m - 550) \quad (5)$$

(wherein $T_m$ (units: ° C.) represents the melting point of the single crystal).

The present invention provides a single crystal heat treatment method wherein the heating step has a fourth step wherein the single crystal is heated at a heating temperature $T_b$ (units: ° C.) which satisfies the conditions represented by formula (6) below in an oxygen-poor atmosphere; a fifth step wherein, subsequent to the fourth step, the atmosphere is converted to an oxygen-containing atmosphere; and a sixth step wherein, subsequent to the fifth step, the single crystal is heated at a temperature of 300° C. to 1150° C. in the oxygen-containing atmosphere $$800 \leq T_b < (T_m - 550) \quad (6)$$

(wherein $T_m$ (units: ° C.) represents the melting point of the single crystal).

The present invention provides a single crystal heat treatment method wherein in the heating step the oxygen-poor atmosphere is an atmosphere containing a total concentration of argon and nitrogen gas of 80 vol % or higher, and an oxygen concentration of less than 0.2 vol %.

The present invention provides a single crystal heat treatment method wherein in the heating step the oxygen-poor atmosphere is an atmosphere containing hydrogen gas at a concentration of 0.5 vol % or more as a reducing gas.

The present invention provides a single crystal heat treatment method wherein prior to the heating step, the single crystal is grown or cooled in an oxygen-free, nitrogen or inert gas atmosphere, or a nitrogen or inert gas atmosphere containing a reducing gas; or is heated in an oxygen-free, nitrogen or inert gas atmosphere, or a nitrogen or inert gas atmosphere containing a reducing gas.

In accordance with the present invention, a single crystal heat treatment method can be provided wherein excellent light output properties are obtained even in a single crystal of the cerium-doped silicate compounds represented by general formulas (1), (2), and (4) above, and especially in a single crystal having as Ln at least one elemental species selected from a group consisting of Dy, Ho, Er, Tm, Yb, Lu, Y, and Sc, which have an ionic radius smaller than Tb.

DESCRIPTION OF THE PREFERRED EMBODIMENTS

Figure 1:
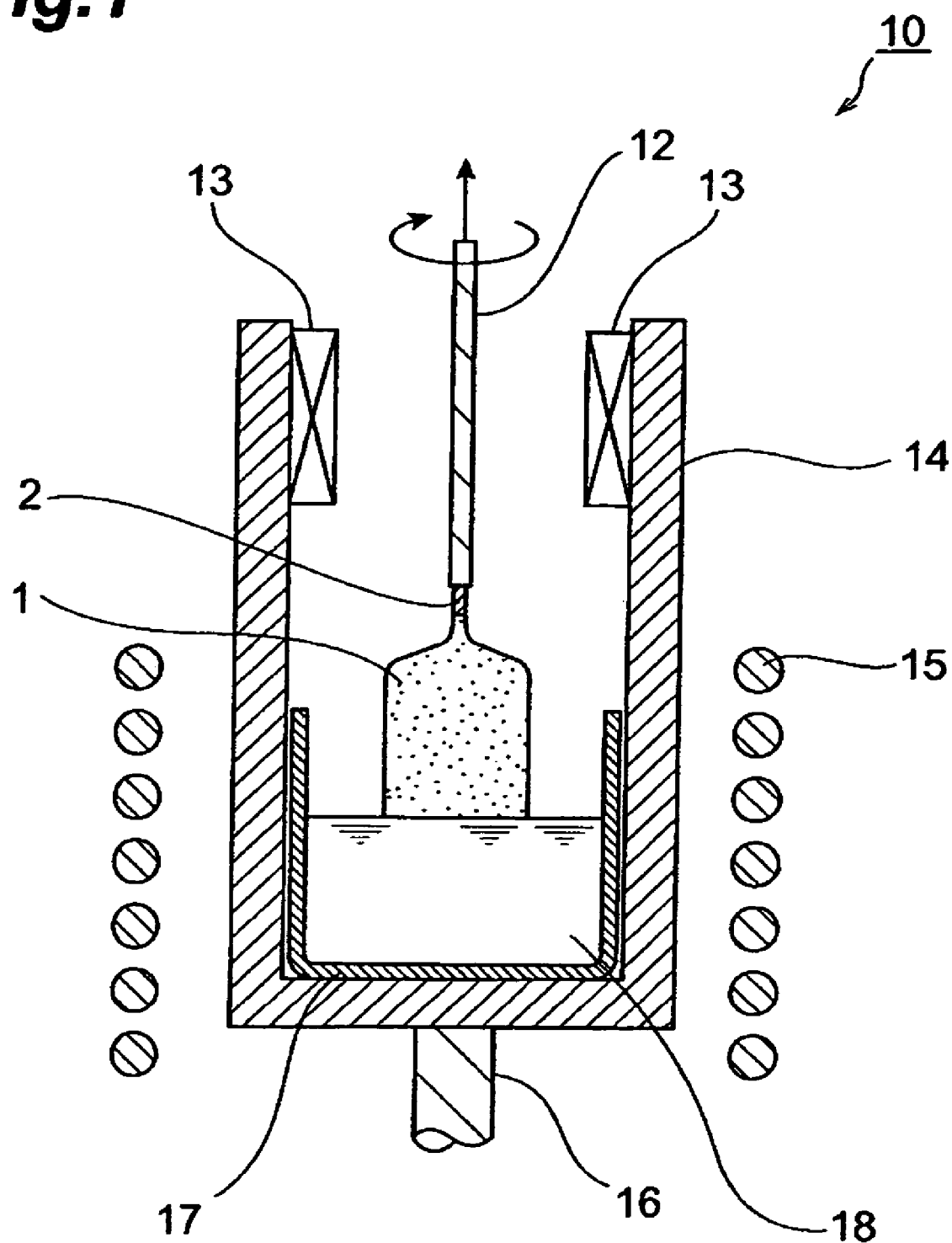
FIG. 1 is a typical cross-sectional view illustrating one example of the basic structure of a growing apparatus for growing a single crystal.

Hereinafter a detailed description of the preferred embodiments of the present invention is provided, but the present invention is by no means limited to the scope presented below.

When single crystals of cerium-doped rare earth orthosilicate compounds are grown or heat-treated in an oxygen-containing atmosphere, trivalent cerium ions, which constitute the luminescent center, are converted to their tetravalent form. It is known that this change causes a reduction in the luminescent center and an increase in fluorescent absorption due to coloration of the crystal, which results in a decrease in light output. This phenomenon tends to be more pronounced as the oxygen concentration in the atmosphere increases and as the heating temperature increases.

In single crystals of specific cerium-doped rare earth orthosilicate compounds the trivalent state of the cerium ions is retained by growing and cooling the crystal in an oxygen-poor atmosphere or by heating it in an oxygen-poor atmosphere. It is believed that a high light output is obtained because the coloration of the crystal is sufficiently inhibited thereby, and absorption of fluorescent due to coloration is sufficiently inhibited. In addition, when single crystals of cerium-doped rare earth orthosilicate compounds are grown and cooled in an atmosphere that contains oxygen, or heated in an oxygen-containing atmosphere, the light output decreases. However, if a heat treatment is subsequently performed in an oxygen-poor atmosphere, the tetravalent cerium ions in the single crystal revert to the trivalent state, which leads to an increase in the luminescent center and decrease in crystal coloration. It is known that the light output is increased thereby because optical transmittance in the crystal is increased. This phenomenon tends to be more pronounced as the oxygen concentration in the atmosphere decreases and also as the concentration in the atmosphere of a reducing gas such as hydrogen and the like increases, or as the heating temperature increases.

In fact, it has been confirmed that good fluorescent properties and an improving effect in fluorescent properties are obtained by the aforementioned crystal growth in an oxygen-poor atmosphere and heat treatment at a high temperature in single crystals of $Gd_{2(1-x)}Ce_{2x}SiO_5$ (cerium-doped gadolinium orthosilicate) and the like. For example, as a single crystal heat treatment method for cerium-doped gadolinium orthosilicate compounds Japanese Patent Registration Number 2701577 discloses a method wherein heat treatment is performed in an oxygen-poor atmosphere at a high temperature (a temperature 50° C. to 550° C. lower than the melting point of the single crystal).

However, it has become clear that with single crystals of the cerium-doped silicate compounds represented by general formula (1) above and single crystals of the cerium-doped gadolinium orthosilicate compounds represented by general formulas (2) and (4) above, the light output background is increased by growing and cooling the single crystals in the aforementioned oxygen-poor atmosphere or by performing a heat treatment in an oxygen-poor atmosphere. It has also become clear that the negative effect of greater variation in light output results thereby. This tendency is especially pronounced when a single crystal of at least one elemental species selected from a group consisting of Dy, Ho, Er, Tm, Yb, Lu, Y and Sc, which have an ionic radius smaller than Tb, is used as Ln. Moreover, this effect tends to become more pronounced as the oxygen concentration in the atmosphere decreases and as the concentration of a reducing gas such as hydrogen and the like in the atmosphere increases, and as the heating temperature increases.

One possible cause is believed to be that in the aforementioned single crystal an oxygen deficiency is formed within the crystal lattice by growing or heat-treating the single crystal in an oxygen-poor atmosphere. It is also believed that because of this oxygen deficiency a non-emitting or low-energy emitting level is formed, the background of light output attributable thereto increases, and as a result the variation in light output increases.

In cerium-doped othosilicates this oxygen deficiency tends to occur often in crystal compositions wherein the crystal structure often assumes a C2/c configuration. In the single crystals of the cerium-doped silicate compound represented by general formula (1) above and single crystals of the cerium-doped gadolinium silicate compounds represented by general formulas (2) and (4) above, the crystal structure assumes a $P2_1/c$ configuration when at least one elemental species selected from a group consisting of La, Pr, Nd, Pm, Sm, Eu, Ga, and Tb, which are elements having an ionic radius larger than Dy, is selected as Ln. On the other hand, when at least one elemental species selected from a group consisting of Dy, Ho, Er, Tm, Yb, Lu, Y and Sc, which have an ionic radius smaller than Tb, is selected as Ln, the crystal structure readily assumes a C2/c configuration. The aforementioned increase in the light output background and variation in light output often occur in single crystals in which the crystal structure readily assumes a C2/c configuration. It is believed this phenomenon is attributable to the fact that the aforementioned oxygen deficiency occurs more frequently as the difference between the ionic radius of the cerium dopant and that of the aforementioned elements that constitute the orthosilicate compound increases.

In fact, in the case of single crystals of the cerium-doped gadolinium silicate compound represented by general formula (3) above, it has been found that the oxygen deficiency tends to occur more often as the ratio of Ln, which has the smaller ionic radius, increases in the composition. In single crystals of cerium-doped orthosilicate compounds wherein an oxygen deficiency often occurs due to the aforementioned crystal composition, it is believed that the oxygen deficiency occurs more or less often depending on whether heating is performed in a neutral atmosphere or an atmosphere containing a trace amount of oxygen, or whether heating is performed at an even lower temperature.

Furthermore, in single crystals of $Lu_{2(1-x)}Ce_{2x}SiO_5$ (cerium-doped lutetium orthosilicate wherein the crystal structure has a C2/c configuration) it is believed that an oxygen deficiency frequently occurs because there is a large difference in ionic radius between the Lu ions and Ce ions.

In single crystals of the aforementioned cerium-doped orthosilicate compounds, when crystal growth is performed by the Czochralski method, the segregation coefficient of the cerium incorporated into the crystal from the crystal melt becomes markedly smaller as the difference increases between the ionic radius of the structural rare earth element and the ionic radius of cerium. Therefore, it is believed that the variation in crystal light output and background may be caused by the fact that variations in the cerium concentration within the crystal ingot often occur.

The inventors have discovered that the variation in light output caused by the aforementioned oxygen deficiency can be reduced by using a step wherein the single crystal is heated in an oxygen-containing atmosphere (hereinafter, referred to as the "heating step"). More specifically, the inventors have discovered that the oxygen deficiency can be sufficiently reduced without converting trivalent cerium ions to the tetravalent form by heat-treating the single crystal at a lower temperature in an oxygen-containing atmosphere. As a result, it is possible to realize the best possible fluorescent properties because it is possible to reduce the background without decreasing the light output and to prevent the variation in light output in a single crystal that has undergone the heat treatment method of the present invention.

The oxygen-containing atmosphere is preferably an atmosphere wherein the oxygen concentration is 100 vol %, or an atmosphere that contains nitrogen or an inert gas and has an oxygen concentration of 1 vol % or higher but less than 100 vol % (for example, an air atmosphere). Within the above range, an atmosphere wherein the oxygen concentration is 30 vol % or higher is preferred, and an atmosphere wherein the oxygen concentration is 50 vol % or higher is especially preferred. With an oxygen concentration of less than 1 vol % the oxygen partial pressure is too low and the oxygen does not disperse easily in the crystal, so it becomes difficult to obtain the aforementioned effect provided by the present invention. As the oxygen concentration increases the improvement increases, and therefore a method wherein a sealed furnace is used and oxygen is circulated therethrough at a constant flow rate is effective.

The heating temperature of the single crystal in the heating step is preferably 300° C. to 1150° C., more preferably 500° C. to 1150° C., and most preferably 700° C. to 1150° C. At a heating temperature of less than 300° C., the effect provided by the present invention tends to be difficult to obtain. If the heating temperature is higher than 1150° C., the cerium ions tend to assume the tetravalent form.

To suppress the conversion of cerium ions to the tetravalent form, it is preferable to add a specific element to the single crystal. It is preferable to add at least one elemental species from a group consisting of Mg, Ca, Sr, Ti, Zr, Hf, V, Nb, Ta, Cr, Mo, W, Sn, As, Sb, and Tb as that specific element. It is more preferable that the specific element be one or more elemental species selected from a group consisting of Mg, Ca, Sr, Ti, Zr, Hf, V, Nb, Ta, Cr, Mo, and W from the standpoint of suppressing the conversion of cerium ions to the tetravalent form with greater certainty. Because Sn, As, Sb, and Th can assume a valence of +4 to +6, it is expected that they have the effect of interfering with the change in cerium ion valence. In a single crystal whereto the aforementioned specific element has been added, the oxygen deficiency can be decreased during the heat treatment to a state such that conversion of cerium ions to the tetravalent form can be suppressed at an even higher temperature. Therefore, excellent fluorescent properties can be realized even more effectively. More specifically, when heating a single crystal whereto the aforementioned element has been added, it is preferable to use a heating temperature of 300° C. to 1500° C., more preferable to use a heating temperature of 500° C. to 1500° C., and most preferable to use a heating temperature of 700° C. to 1300° C. Charge compensation is believed to be a factor whereby the change in cerium ion valence can be suppressed by the addition of the specific element to the single crystal. However, the suppression of the change in cerium ion valence is not limited to that factor alone.

The effect of the heat treatment method of the present invention on a cerium-doped orthosilicate single crystal is even greater when it is applied to a single crystal with an increased oxygen deficiency density because it has been grown or cooled in an oxygen-poor atmosphere, or to a single crystal with an increased oxygen deficiency density because it has been heated in an oxygen-poor atmosphere. Moreover, the ratio of the one or more elemental species selected from a group consisting of Dy, Ho, Er, Tm, Yb, Lu, Y, and Sc, which have an ionic radius smaller than Tb, as Ln is preferably high in the crystal compositions represented by general formulas (1), (2), and (4). The aforementioned effect of the present invention is even greater thereby because the difference in ionic radius between Ln and the cerium ions becomes greater, and it becomes easier for the single crystal to assume a C2/c configuration.

The single crystal heat treatment method of the present invention may have a first step wherein the aforementioned heating step heats the single crystal at a temperature of 300° C. to 1150° C. in an oxygen-containing atmosphere; a second step wherein subsequent to the first step the atmosphere is converted to an oxygen-poor atmosphere while the heating temperature is maintained; and a third step wherein subsequent to the second step the single crystal is heated at temperature $T_a$ (units: ° C.), which is higher than the aforementioned heating temperature and satisfies the conditions represented by formula (5) above, in an oxygen-poor atmosphere.

Initially, in the first step it is possible to disperse oxygen throughout the crystal in the cerium-doped orthosilicate single crystal and reduce the oxygen deficiency by heating the single crystal at a relatively low temperature in an oxygen-containing atmosphere. Next, the aforementioned effect of the present invention tends to be increased after converting the atmosphere to an oxygen-poor atmosphere in the second step without cooling the single crystal by heating the single crystal in the third step at a high temperature that does not bring about an oxygen deficiency. This increased effect is believed to occur because the oxygen atoms introduced into the crystal are dispersed efficiently to their positions in the crystal lattice by performing the heat treatment at a higher temperature. At that time, it is necessary to convert the atmosphere in the second step to an oxygen-poor atmosphere to prevent the changeover of trivalent cerium ions to the tetravalent form.

The oxygen-containing atmosphere in the first step is preferably an atmosphere wherein the oxygen concentration is 100 vol %, or an atmosphere that contains nitrogen or an inert gas and has an oxygen concentration of 1 vol % or higher but less than 100 vol % (for example, an air atmosphere). Within the above range, an atmosphere wherein the oxygen concentration is 30 vol % or higher is preferred, and an atmosphere wherein the oxygen concentration is 50 vol % or higher is especially preferred.

The heating temperature of the single crystal in the first step is preferably 300° C. to 1150° C., more preferably 500° C. to 1150° C., and most preferably 700° C. to 1150° C. When the aforementioned specific element is added to the single crystal the heating temperature of the single crystal in the first step is preferably 300° C. to 1500° C., more preferably 500° C. to 1500° C., and most preferably 700° C. to 1300° C.

The heating temperature $T_a$ of the single crystal in the third step is more preferably 800° C. to 1400° C. Moreover, preferably the total concentration of argon and nitrogen in the oxygen-poor atmosphere is 80 vol % or higher and the oxygen concentration is less than 0.2 vol %, more preferably the oxygen concentration is less than 0.1 vol %, and most preferably it is 300 vol ppm or less.

The single crystal heat treatment method of the present invention may have a fourth step wherein the aforementioned heating step heats the single crystal at heating temperature $T_b$ (units: ° C.) which satisfies the conditions of formula (6) above in an oxygen-poor atmosphere; a fifth step wherein subsequent to the fourth step the atmosphere is converted to an oxygen-containing atmosphere; and a sixth step wherein subsequent to the fifth step the single crystal is heated at a temperature of 300° C. to 1150° C. in an oxygen-containing atmosphere.

Initially, in the fourth step the remaining tetravalent cerium ions are converted to the trivalent form without markedly increasing the oxygen deficiency by heating the single crystal at a temperature that satisfies the conditions represented in formula (6) above in an oxygen-poor atmosphere. Next, after the atmosphere is converted to an oxygen-containing atmosphere in the fifth step, the single crystal is heated in the sixth step at a temperature such that the trivalent cerium ions do not switch to the tetravalent form. It is possible thereby to obtain high fluorescent properties wherein the light output is even higher, and the variation in light output properties due to the increase in background fluorescent is even smaller.

A temperature may be applied as the heating temperature in the fourth step if it is greater than or equal to $(T_m-550)°$ C. and is less than or equal to the melting temperature of the crystal $T_m°$ C. The reason is because even if an oxygen deficiency occurs in the single crystal during the fourth step, it is possible to reduce the oxygen deficiency by the heat treatment in the sixth step if the valence of the cerium ions can be switched to the trivalent form. In the present invention, in the fifth step subsequent to the fourth step, the heating in an oxygen-containing atmosphere may be performed using the same heating furnace or a different heating furnace after cooling the single crystal once to room temperature. Moreover, in the sixth step the heat treatment may be performed on the single crystal after converting the atmosphere to an oxygen-containing atmosphere while maintaining heating temperature $T_b$ in the fifth step subsequent to the fourth step.

In the fourth step preferably the total concentration of argon and nitrogen in the oxygen-poor atmosphere is 80 vol % or higher and the oxygen concentration is less than 0.2 vol %, more preferably the oxygen concentration is less than 0.1 vol %, and most preferably it is 300 vol ppm or less. Moreover, the oxygen-poor atmosphere can provide the aforementioned effect of the present invention more effectively when it contains 0.5 vol % or more of hydrogen gas as a reducing gas, and can provide the aforementioned effect of the present invention even more effectively when it contains 5 vol % or more of hydrogen gas.

The heating temperature $T_b$ in the fourth step is more preferably 1000° C. to 1500° C., and most preferably 1200° C. to 1400° C. If $T_b$ is less than 800° C., the aforementioned effect of the present invention tends to be difficult to obtain.

The oxygen-containing atmosphere of the fifth step is preferably an atmosphere wherein the oxygen concentration is 100 vol %, or an atmosphere that contains nitrogen or an inert gas and has an oxygen concentration of 1 vol % or higher but less than 100 vol % (for example, an air atmosphere). Within the above range, an atmosphere wherein the oxygen concentration is 30 vol % or higher is preferred, and an atmosphere wherein the oxygen concentration is 50 vol % or higher is especially preferred.

A heating temperature of the single crystal in the sixth step of 500° C. to 1150° C. is more preferred, and of 700° C. to 1150° C. is especially preferred. When the aforementioned specific element is added to the single crystal, a heating temperature of the single crystal in the sixth step of 300° C. to 1500° C. is preferred, a heating temperature of 500° C. to 1500° C. is more preferred, and a heating temperature of 700° C. to 1300° C. is most preferred.

A time of 1 to 20 hours is suitable as the time (hereinafter, referred to as the "treatment time") required for the process step of heating (hereinafter, referred to as the "heating step") in the heat treatment method of the present invention for a single crystal with dimensions of 4 mm×6 mm×20 mm. When the treatment time is less than 1 hour, the effect of the present invention often tends to be insufficient. On the other hand, because the effect of the present invention does not increase with a treatment time exceeding 20 hours, such a treatment time tends to be inefficient and uneconomical. However, it is believed that the effect of the present invention is based on the dispersion of elemental oxygen within the crystal lattice as described above. Therefore, the time required to obtain a uniform effect in the entire crystal block is dependent on the crystal size. Because a longer treatment time is required as the crystal size increases, no upper limit to the treatment time can be stipulated. Moreover, the treatment time and heating temperature for single crystals of the aforementioned cerium-doped rare earth orthosilicate compounds may require some adjustment. For example, the treatment time may need to be adjusted if the heating temperature is near the boundary with the temperature at which the conversion from trivalent cerium ions to tetravalent cerium ions eliminates, or with the temperature at which an oxygen deficiency occurs. This is because when the treatment time is too long for the single crystal size, the effect of the heat treatment will diminish, even if it is within 20 hours, and conversely, the light output will be adversely affected.

The preferred timing for applying the heat treatment method of the present invention (timing for starting the heating step) is one wherein after the grown crystal is cut and processed to the smallest predetermined dimensions, the effect of the present invention is easily obtained in a short time. However, it is possible to apply the heat treatment method of the present invention to an ingot if the crystal size of the unprocessed crystal ingot is relatively small. Moreover, the heat treatment method of the present invention may be applied in continuation with or partially overlapping with the cooling step subsequent to the crystal growth step of the Czochralski method and the like by an inline heating step in the growth furnace. In addition, in the case of crystal growth by the Czochralski method and the like, the heating step may be applied before removal of the crystal from the crystal melt The growth of crystals such as single crystals and the like that is performed prior to the heat treatment method of the present invention may be performed by conventional means. For example, it may be a single crystal growth method comprising a melting process step wherein a melt is obtained in which the starting material is prepared in a molten state through a melting method, and a cooling and solidifying process step in which a single crystal ingot is obtained by cooling and hardening of the melt.

The melting method of the aforementioned melting process step may be the Czochralski method. If this method is used, it is preferable to perform the melting process step and the cooling and solidifying process step using a crystal growth lifting apparatus 10 having the structure shown in FIG. 1.

FIG. 1 is a typical cross-sectional view illustrating one example of the basic structure of a growing apparatus for growing a single crystal in the present invention. The lifting apparatus 10 shown in FIG. 1 comprises a high-frequency induction heating furnace (2-zone heating growth furnace) 14. The high-frequency induction heating furnace 14 is one for performing operations in the aforementioned melting process step, and the cooling and solidifying process step sequentially.

In this high-frequency induction heating furnace 14 the refractory side walls form a cylindrical vessel with a bottom, and the shape per se of the cylindrical vessel with a bottom is similar to that used in single crystal growth based on the publicly known Czochralski method. A high frequency induction coil 15 is wrapped around the walls at the bottom of the high frequency induction furnace 14. In addition, a crucible 17 (for example, a crucible made of iridium) is arranged on the bottom within the high frequency induction furnace 14. This crucible 17 also serves as the high frequency induction thermal heater. In addition, when the single crystal starting material is placed into the crucible 17 and high frequency induction is applied to the high frequency induction coil 15, the crucible 17 is heated and a melt 18 comprising the constituent materials of the single crystal is obtained.

Moreover, a heater 13 (resistance thermal heater) is additionally positioned on the upper part of the inner wall surface such that does not come in contact with the melt 18 of the high frequency induction furnace 14. The thermal output of this heater can be controlled independently of the high frequency induction coil 15.

Furthermore, in the center of the bottom of the high frequency induction furnace 14 an opening (not illustrated) is provided that passes through to the exterior from the interior of the high frequency induction furnace 14. A crucible support rod 16 is inserted through this opening from the exterior of the high frequency induction furnace 14, and the tip of the crucible support rod 16 is in contact with the bottom of the crucible 17. By rotating this crucible support rod 16 it is possible to rotate the crucible 17 in the high frequency induction furnace 14. The space between the opening and the crucible support rod 16 is sealed with packing and the like.

Next the specific manufacturing method using the lifting aperture 10 will be explained.

First, in the melting process step the single crystal starting material is placed in the crucible 17, and the melt 18 comprising the single crystal constituent materials is obtained by applying high frequency induction to the high frequency induction coil 15. Examples of single crystal starting material include, for example, single oxides and/or complex oxides of metal elements that constitute the single crystal. Ultrapure products from Shin-Etsu Chemical Co., Ltd., Stanford Material Corporation, Tama Chemicals Co., Ltd. and the like are preferred as commercial products.

Next, in the cooling and solidifying process step a cylindrical single crystal ingot 1 is obtained by cooling and solidifying the melt. More specifically, the operation is divided into two process steps, a crystal growing step and a cooling step that are described below.

First in the crystal growing step a pulling shaft 12 having a seed crystal 2 attached to the tip thereof is lowered into the melt 18 from the top of the high frequency induction furnace 14. Next the single crystal ingot 1 is formed by withdrawing the pulling shaft 12. At this time the heating output of the heater 13 is adjusted during the crystal growing step so that the single crystal ingot 1 pulled from the melt 18 is grown until a cross-section thereof reaches a predetermined diameter.

Next, in the cooling step the thermal output of the heater is adjusted so that the grown single crystal ingot (not illustrated) obtained after the crystal growing step will cool.

The present invention concerns a single crystal heat treatment method that improves the light output of the aforementioned cerium-doped orthosilicate single crystals, the scintillator properties such as energy resolution and background light output and the like, and the variation thereof within crystals and between crystal ingots.

The valence state of the cerium ions in the cerium-doped orthosilicate single crystal greatly affects light output A change from the trivalent cerium ion state, which is a luminescent center, to a tetravalent cerium ion state, which causes coloration and fluorescent absorption, and becomes a non-luminescent center, occurs by heating the single crystal in an oxygen-containing atmosphere (for example, an atmosphere in which the oxygen concentration is 1 vol % or higher). Conversely, the cerium ions return to a trivalent state when the single crystal is heated in an oxygen-poor atmosphere (for example, an atmosphere in which the oxygen concentration is less than 0.2 vol %). In other words, the change between the trivalent and tetravalent state of cerium ions is a reversible change. In addition, the oxygen deficiency that occurs in cerium-doped orthosilicate single crystals affects the background intensity of light output. This oxygen deficiency increases variations such as differences within the light emitting crystals, differences between the ingots wherefrom they are obtained, and day-to-day variations and time-course changes due to exposure to natural light, including ultraviolet light, and the like. This oxygen deficiency is believed to be caused by crystal growth and/or cooling, or by heat treatment at a high temperature relatively close to the crystal melting point in an oxygen-poor atmosphere. The present invention inhibits the two actions of a valence shift in the cerium ions and the occurrence of an oxygen deficiency by the conditions of the atmosphere and the heating temperature in the heating step. Thus, the present invention provides a method for improving scintillator properties thereby. However, the effect of the present invention is not limited to the aforementioned phenomena.

In accordance with the present invention single crystals of the cerium-doped silicate compounds represented by general formulas (1), (2), and (4) above can achieve a stable, high level of light output and have extremely little variation due to differences within single crystals, differences between ingots wherefrom they are obtained, and day-to-day variations and time-course changes due to exposure to natural light, including ultraviolet light, and the like. Similar benefits can be obtained with these single crystals even when they use at least one elemental species selected from a group comprising Dy, Ho, Er, Tm, Yb, Lu, Y, and Sc, which have an ionic radius smaller than Tb, as Ln.

EXAMPLES

The present invention is described in greater detail below through examples, but the present invention is by no means limited to these examples.

Comparative Example 1

Single crystals were manufactured based on the publicly known Czochralski method. First, as starting material for a $Gd_{2-(r+s)}Lu_rCe_sSiO_5$ (r=1.8, s=0.002) single crystal, 500 g of a mixture of gadolinium oxide ($Gd_2O_3$, 99.99 wt % purity), lutetium oxide ($Lu_2O_3$, 99.99 wt % purity), silicon dioxide ($SiO_2$, 99.9999 wt % purity), and cerium oxide ($CeO_2$, 99.99 wt % purity) that matched the specified stoichiometric composition was placed in an iridium crucible 50 mm in diameter, 50 mm tall and 2 mm thick. Next, the mixture was heated to its melting point (approximately 2050° C.) in the high frequency induction furnace and melted to obtain a melt. The melting point was measured with an electronic optical pyrometer (Chino Corporation, Pyrostar® Model UR-U).

Next, the tip of the pulling shaft having a seed crystal attached thereto was lowered into the melt and seeding was performed. Next, the neck section was formed by pulling the single crystal ingot at a pull rate of 1.5 mm/h. Thereafter, pulling of the cone section was performed, and when a diameter of 25 mm was reached, pulling of the body was initiated at a pull rate of 1 mm/h. After the body had been grown, the single crystal ingot was freed from the melt and cooling was initiated.

During crystal growth nitrogen gas with a flow rate of 4 L/min was streamed continuously within the growth furnace. The oxygen concentration in the furnace at that time was measured by a zirconia sensor (Tohken Co., Ltd., ECOAZ-CG® $O_2$ ANALYZER), and it was confined that the oxygen concentration was 100 vol ppm or lower.

After cooling was completed the single crystal obtained thereby was removed from the furnace. The single crystal ingot weighed approximately 250 g, the length of the cone section was approximately 30 mm, and the length of the body section was approximately 70 mm.

A plurality of rectangular crystal samples measuring 4 mm×6 mm×20 mm were cut from the single crystal ingot obtained thereby. Chemical etching was performed on the crystal samples with phosphoric acid, and the entire surface of the sample crystals was given a mirror finish. Then two mirror-polished crystal samples were selected arbitrarily from the plurality of crystal samples.

One of the 4 mm×6 mm surfaces (hereinafter, referred to as the "radiation incident surface") the among the 6 surfaces on the 4 mm×6 mm×20 mm rectangular crystal samples was excluded, and the remaining 5 surfaces were coated with polytetrafluoroethylene (PTFE) tape as a reflective material. Next, the aforementioned radiation incident surface of each sample, which was not coated with the PTFE tape, was immobilized on the photomultiplying plane (photoelectric conversion plane) in a photomultiplier tube (Hamamatsu Photonics, R878) using optical grease. Then, the light output, energy resolution and background of each sample was evaluated by irradiating each sample with gamma radiation of 611 KeV using $^{137}$Cs and measuring the energy spectrum of each sample. The energy spectrum was measured when a voltage of 1.45 kV was applied to the photomultiplier tube, the signal from the dynode was amplified by a preamplifier (ORTEC® Model 113) and a waveform shaping amplifier (ORTEC® Model 570), and measured with a multichannel analyzer (MCA) (PGT, Quantum MCA4000®). The results are shown in Table 1.

high frequency induction furnace and melted to obtain a melt. The melting point was measured with an electronic optical pyrometer (Chino Corporation, Pyrostar® Model UR-U).

Next, the tip of the pulling shaft having a seed crystal attached thereto was lowered into the melt and seeding was performed. Next, the neck section was formed by pulling the single crystal ingot at a pull rate of 1.5 mm/h. Thereafter, pulling of the cone section was performed, and when a diameter of 25 mm was reached, pulling of the body was initiated at a pull rate of 1 mm/h. After the body had been grown, the single crystal ingot was freed from the melt and cooling was initiated. During crystal growth nitrogen gas with a flow rate of 4 L/min was streamed continuously within the growth furnace. The oxygen concentration in the furnace at that time was measured by a zirconia sensor (Tohken Co., Ltd., ECOAZ-CG® $O_2$ ANALYZER), and it was confirmed that the oxygen concentration was 100 vol ppm or lower.

After cooling was completed the single crystal obtained thereby was removed from the furnace. The single crystal ingot weighed approximately 3500 g, the length of the cone section was approximately 40 mm, and the length of the body section was approximately 170 mm. The energy spectrum of

TABLE 1

| | | Heating step conditions | | Energy | | |
| | Crystal composition | Atmosphere | Temperature T(° C.) | Light output (ch) | resolution (%) | Background (mV) |
|---|---|---|---|---|---|---|
| Comparative Example 1 | $Gd_{2-(r+s)}Lu_rCe_sSiO_5$ (r = 1.8, s = 0.002) | — | — | 830.2<br>Not measurable | 13.5<br>Not measurable | 10<br>50 |
| Comparative Example 2 | $Gd_{2-(r+s)}Lu_rCe_sSiO_5$ (r = 1.8, s = 0.003) | — | — | Not measurable<br>Not measurable | Not measurable<br>Not measurable | 50<br>50 |
| Comparative Example 3 | $Gd_{2-(r+s)}Lu_rCe_sSiO_5$ (r = 0.4, s = 0.02) | — | — | 612.6<br>590.8 | 12.2<br>13.1 | 20<br>10 |
| Comparative Example 4 | $Gd_{2-(r+s)}Lu_rCe_sSiO_5$ (r = 1.8, s = 0.002) | Nitrogen atmosphere | 1000 | Not measurable<br>Not measurable | Not measurable<br>Not measurable | 50<br>50 |
| Comparative Example 5 | $Gd_{2-(r+s)}Lu_rCe_sSiO_5$ (r = 1.8, s = 0.003) 0.0088 wt % Ca added | — | — | 962<br>1084 | 12.7<br>11.7 | —<br>— |
| Comparative Example 6 | $Y_{2-(x+y)}Lu_xCe_ySiO_5$ (x = 1.8, y = 0.003) | — | — | Not measurable<br>Not measurable | Not measurable<br>Not measurable | 40<br>40 |

Comparative Example 2

Samples were prepared in the same manner as Comparative Example 1 except in place of the $Gd_{2-(r+s)}Lu_rCe_sSiO_5$ (r=1.8, s=0.002) single crystal, a $Gd_{2-(r+s)}Lu_rCe_sSiO_5$ (r=1.8, s=0.003) single crystal was grown.

Comparative Example 3

Single crystals were manufactured based on the publicly known Czochralski method. First, as starting material for a $Gd_{2-(r+s)}Lu_rCe_sSiO_5$ (r=0.4, s=0.02) single crystal, 5400 g of a mixture of gadolinium oxide ($Gd_2O_3$, 99.99 wt % purity), lutetium oxide ($Lu_2O_3$, 99.99 wt % purity), silicon dioxide ($SiO_2$, 99.9999 wt % purity), and cerium oxide ($CeO_2$, 99.99 wt % purity) that matched the specified stoichiometric composition was placed in an iridium crucible 110 mm in diameter, 110 mm tall and 2 mm thick. Next, the mixture was heated to its melting point (approximately 1980° C.) in the the crystal samples was measured in the same manner as in Comparative Example 1. For Comparative Example 3 an energy spectrum measurement of the crystal samples was performed before the heat treatment.

Comparative Example 4

The preparation was the same as in Comparative Example 1 until the crystal samples were cut. Two crystal samples were selected arbitrarily from the plurality of crystal samples, mounted on a platinum plate, and placed in an electric furnace. Nitrogen was streamed within the electric furnace to create an oxygen-poor atmosphere (0.2 vol % or less). Next, in the heating step the temperature in the electric furnace was raised over approximately 4 hours in the oxygen-poor atmosphere, and after the temperature was maintained for 5 hours at 1000° C., the inside of the furnace was cooled to room temperature over approximately 10 hours. The energy spectrum of the crystal samples was measured in the same manner as in Comparative Example 1.

Comparative Example 5

Crystal samples were obtained in the same manner as in Comparative Example 2 except that 0.044 g of calcium carbonate ($CaCO_3$, 99.99 wt % purity) (equivalent to 0.0088 wt % Ca) was added to the single crystal starting material. The energy spectrum of those crystal samples was measured in the same manner as in Comparative Example 1.

Comparative Example 6

Samples were prepared in the same manner as Comparative Example 1 except in place of the $Gd_{2-(r+s)}Lu_rCe_sSiO_5$ (r=1.8, s=0.002) single crystal, a $Y_{2-(x+y)}Lu_xCe_ySiO_5$ (x=1.8, y=0.003) single crystal was grown. The energy spectrum of those crystal samples was measured in the same manner as in Comparative Example 1.

Example 1

The preparation was the same as in Comparative Example 1 until the crystal samples were cut. Two crystal samples were selected arbitrarily from the plurality of crystal samples, mounted on a platinum plate, and placed in an electric furnace. Next, in the heating step the temperature in the electric furnace was raised over approximately 4 hours in an air atmosphere, and after the temperature was maintained for 5 hours at 300° C., the inside of the furnace was cooled to room temperature over approximately 10 hours. The energy spectrum of the crystal samples was measured in the same manner as in Comparative Example 1.

Example 2

Samples were prepared in the same manner as Example 1 except the heating temperature in the electric furnace was changed from 300° C. to 500° C.

Example 3

Samples were prepared in the same manner as Example 1 except the heating temperature in the electric furnace was changed from 300° C. to 700° C.

Example 4

Samples were prepared in the same manner as Example 1 except the heating temperature in the electric furnace was changed from 300° C. to 1000° C.

Example 5

The preparation was the same as in Comparative Example 2 until the crystal samples were cut. Two crystal samples were selected arbitrarily from the plurality of crystal samples, mounted on a platinum plate, and placed in an electric furnace. Next, in the heating step the temperature in the electric furnace was raised over approximately 4 hours in an air atmosphere, and after the temperature was maintained for 5 hours at 1000° C., the inside of the furnace was cooled to room temperature over approximately 10 hours. The energy spectrum of the crystal samples was measured in the same manner as in Comparative Example 1.

Example 6

The preparation was the same as in Comparative Example 3 until the crystal samples were cut. Two crystal samples were selected arbitraily from the plurality of crystal samples, mounted on a platinum plate, and placed in an electric furnace. Next, in the heating step the temperature in the electric furnace was raised over approximately 4 hours in an air atmosphere, and after the temperature was maintained for 5 hours at 1200° C., the inside of the furnace was cooled to room temperature over approximately 10 hours. The energy spectrum of the crystal samples was measured in the same manner as in Comparative Example 1.

Example 7

The preparation was the same as in Example 1 until the crystal samples were cut. Two crystal samples were selected arbitrarily from the plurality of crystal samples, mounted on a platinum plate, and placed in an electric furnace. Next, in the heating step the temperature in the electric furnace was raised over approximately 4 hours in an air atmosphere, and after the temperature was maintained for 5 hours at 1200° C., the inside of the furnace was cooled to room temperature over approximately 10 hours. The energy spectrum of the crystal samples was measured in the same manner as in Comparative Example 1.

Example 8

Crystal samples were obtained in the same manner as in Example 5 except that 0.044 g of calcium carbonate ($CaCO_3$, 99.99 wt % purity) (equivalent to 0.0088 wt % Ca) was added to the single crystal starting material. Two crystal samples were selected arbitrarily from the plurality of crystal samples, mounted on a platinum plate, and placed in an electric furnace. Next, in the heating step the temperature in the electric furnace was raised over approximately 4 hours in an air atmosphere, and after the temperature was maintained for 5 hours at 1200° C., the inside of the furnace was cooled to room temperature over approximately 10 hours. The energy spectrum of the crystal samples was measured in the same manner as in Comparative Example 1.

Example 9

Crystal samples were obtained in the same manner as Example 1 except the atmosphere in the electric furnace was changed from an air atmosphere to an atmosphere with an oxygen stream (oxygen concentration in the furnace: 100 vol %), and the heating temperature was changed from 300° C. to 1000° C. The energy spectrum of the crystal samples was measured in the same manner as in Comparative Example 1.

Example 10

In the heating step after a temperature of 700° C. was maintained initially for 5 hours in an air atmosphere, and after the atmosphere in the electric furnace was changed from an air atmosphere to a nitrogen atmosphere (oxygen concentration in the furnace: 100 vol ppm or less) while maintaining a temperature of 700° C. in the furnace, the temperature was maintained at 1000° C. for 5 hours. Then the inside of the furnace was cooled over approximately 10 hours. The rest of the preparation was performed in the same manner as Example 1. The energy spectrum of the crystal samples was measured in the same manner as in Comparative Example 1.

Example 11

In the heating step after a temperature of 1500° C. was maintained initially for 5 hours in a nitrogen atmosphere (oxygen concentration in the furnace: 100 vol ppm or less), the inside of the furnace was cooled over approximately 10 hours. Thereafter, a temperature of 1000° C. was maintained for 5 hours in an air atmosphere in the furnace, and then the inside of the furnace was cooled over approximately 10 hours. The rest of the preparation was performed in the same manner as Example 1. The energy spectrum of the crystal samples was measured in the same manner as in Comparative Example 1.

Example 12

The preparation was the same as in Example 4 until the crystal samples were cut. Two crystal samples were selected arbitrarily from the plurality of crystal samples, mounted on a platinum plate, and placed in an electric furnace. Next, in the heating step the temperature in the electric furnace was raised over approximately 4 hours in an air atmosphere, and after the temperature was maintained for 5 hours at 1000° C., the inside of the furnace was cooled to room temperature over approximately 10 hours. The energy spectrum of the crystal samples was measured in the same manner as in Comparative Example 1.

Tables 1 and 2 show the results of the light output, energy resolution, and background in the crystal samples from Comparative Examples 2 to 6 and Examples 1 to 12. The entries in Table 1 of "not measurable" mean that accurate measurements of light output and energy resolution could not be made because the background was too high.

4, the background and light output are improved over those crystals. More specifically, with a heat treatment of 700° C. to 1150° C., it was confirmed that the light output is the largest and the effect is greatest. It is believed that this result is obtained because the oxygen deficiency in the crystal was reduced by the heat treatment. In addition, in Example 5 the cerium concentration was set at y=0.003, and in this single crystal a similar effect was confirmed.

However, when a heat treatment was performed at a high temperature of 1200° C. or higher in air such as in the crystals of Examples 6 and 7, although the background was improved, it was confirmed that the light output decreased. This result is believed to be due to the conversion of cerium ions in the crystal from the trivalent to the tetravalent form. Using the same heat treatment with single crystals wherein a specific element is added as in Example 8, the effect of the present invention was obtained accompanying that heat treatment because the valence of the cerium ions does not change as easily, and an increase in light output and improvement in background were confirmed.

In addition, no improvement in background was seen in the single crystal of Comparative Example 4 even when the heat treatment was performed at 1000° C. in nitrogen. It is believed that, conversely, this result was due to a increase in oxygen deficiency caused by heating in the nitrogen atmosphere.

In Example 9 the atmosphere in the heating step was changed from the air atmosphere of Examples 1 to 4 to an

TABLE 2

| | Crystal composition | Heating step conditions | | Energy | | |
| | | Atmosphere | Temperature $T(° C.)$ | Light output (ch) | resolution (%) | Background (mV) |
|---|---|---|---|---|---|---|
| Example 1 | $Gd_{2-(r+s)}Lu_rCe_sSiO_5$ $(r = 1.8, s = 0.002)$ | Air atmosphere | 300 | 705.4 903.5 | 17.5 17.6 | 0 0 |
| Example 2 | | | 500 | 965.4 813.7 | 13.5 19.2 | 0 0 |
| Example 3 | | | 700 | 985.2 977.0 | 14.4 13.8 | 0 0 |
| Example 4 | | | 1000 | 987.1 995.5 | 11.8 12.1 | 0 0 |
| Example 5 | $Gd_{2-(r+s)}Lu_rCe_sSiO_5$ $(r = 1.8, s = 0.003)$ | | | 1030.8 1028.0 | 12.3 11.7 | 0 0 |
| Example 6 | $Gd_{2-(r+s)}Lu_rCe_sSiO_5$ $(r = 0.4, s = 0.02)$ | | 1200 | 260.18 276.81 | 13.04 12.52 | 0 0 |
| Example 7 | $Gd_{2-(r+s)}Lu_rCe_sSiO_5$ $(r = 1.8, s = 0.002)$ | | | 620.3 704.2 | 14.5 17.9 | 0 0 |
| Example 8 | $Gd_{2-(r+s)}Lu_rCe_sSiO_5$ $(r = 1.8, s = 0.003)$ 0.0088 wt % Ca added | | | 1266 1229 | 12.7 11.5 | 0 0 |
| Example 9 | $Gd_{2-(r+s)}Lu_rCe_sSiO_5$ $(r = 1.8, s = 0.02)$ | Oxygen atmosphere | 1000 | 1012.7 984.5 | 13.04 12.2 | 0 0 |
| Example 10 | | Air atmosphere → Nitrogen atmosphere | 700 → 1000 | 988.8 1020.0 | 12.0 12.3 | 0 0 |
| Example 11 | | Nitrogen atmosphere → Air atmosphere | 1500 → 1000 | 1018.5 1001.6 | 11.7 13.1 | 0 0 |
| Example 12 | $Y_{2-(x+y)}Lu_xCe_ySiO_5$ $(x = 1.8, y = 0.003)$ | Air atmosphere | 1000 | 970.0 950.4 | 12.2 13.1 | 0 0 |

The following points are clear from Tables 1 and 2. In the crystals grown in a nitrogen atmosphere such as in Comparative Examples 1 and 2, it appears that many oxygen deficiencies are present in the crystal. Due to the effect thereof, the background is high and the light output is low, or the measurement of light output cannot be performed. On the other hand, when the heat treatment is performed in an air atmosphere at various temperature conditions as in Examples 1 to oxygen-streaming atmosphere, and the heat treatment was performed at 1000° C. As a result, a further increase in light output was confirmed in comparison to the case in which the heat treatment was performed at the same temperature in an air atmosphere (Example 4). Example 10 is one wherein the heat treatment was performed by initially heating in an air atmosphere at 700° C., converting the atmosphere to a nitrogen atmosphere while maintaining the temperature, and then raising the temperature to 1000° C. Moreover, Example 11 is one wherein the heat treatment was performed after initially heating to 1500° C. in a nitrogen atmosphere, cooling, converting the atmosphere to an air atmosphere, and reheating at 1000° C. In these examples as well it was confirmed that the fluorescent properties were increased more than in Examples 1 to 4 wherein the heat treatment was performed only in an air atmosphere.

Example 6 is one wherein the Gd in the crystal composition of Comparative Example 1 was replaced with Y. Just as in Comparative Example 1, in Comparative Example 6 the background was high and the light output could not be measured. On the other hand, when the heat treatment was performed as in Example 12, improvements in background and light output were confirmed. In fact, it can be said that these results are similar to those of Example 4. Judging from the above, it can be said that a similar effect is obtained from the heat treatment when Gd is replaced by Y in the crystal composition.

What is claimed is:

1. A single crystal heat treatment method, comprising a step of heating a single crystal of a cerium-doped silicate compound represented by general formula (1) or (2) below in an oxygen-containing atmosphere, wherein the oxygen-containing atmosphere is an atmosphere having an oxygen concentration of 100 vol %, or an atmosphere containing nitrogen or an inert gas and having an oxygen concentration of 1 vol % or higher but less than 100 vol %, wherein the single crystal is heated at a temperature ranging from 300° C. to 1150° C. in the heating step $$Y_{2-(x+y)}Ln_xCe_ySiO_5 \qquad (1)$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \qquad (2)$$

(wherein Ln represents at least one elemental species selected from a group consisting of elements belonging to the rare earth elements, z represents a numerical value greater than 0 but less than or equal to 2, and w represents a numerical value greater than 0 but less than or equal to 0.2).

2. A single crystal heat treatment method, comprising a step of heating a single crystal of a cerium-doped silicate compound represented by general formula (3) below in an oxygen-containing atmosphere, wherein the oxygen-containing atmosphere is an atmosphere having an oxygen concentration of 100 vol %, or an atmosphere containing nitrogen or an inert gas and having an oxygen concentration of 1 vol % or higher but less than 100 vol %, wherein the single crystal is heated at a temperature ranging from 300° C. to 1150° C. in the heating step $$Gd_{2-(p+q)}Ln_pCe_qSiO_5 \qquad (3)$$

(wherein Ln represents at least one elemental species selected from a group consisting of Dy, Ho, Er, Tm, Yb, Lu, Y and Sc, which are rare earth elements having an ionic radius smaller than Tb, p represents a numerical value greater than 0 but less than or equal to 2, and q represents a numerical value greater than 0 but less than or equal to 0.2).

3. A single crystal heat treatment method, comprising a step of heating a single crystal of a cerium-doped silicate compound represented by general formula (4) below in an oxygen-containing atmosphere, wherein the oxygen-containing atmosphere is an atmosphere having an oxygen concentration of 100 vol %, or an atmosphere containing nitrogen or an inert gas and having an oxygen concentration of 1 vol % or higher but less than 100 vol %, wherein the single crystal is heated at a temperature ranging from 300° C. to 1150° C. in the heating step $$Gd_{2-(r+s)}Lu_rCe_sSiO_5 \qquad (4)$$

(wherein r represents a numerical value greater than 0 but less than or equal to 2, and s represents a numerical value greater than 0 but less than or equal to 0.2).

4. The single crystal heat treatment method of claim 1, wherein the heating temperature ranges from 700° C. to 1150° C.

5. A single crystal heat treatment method, comprising a step of heating a single crystal of a cerium-doped silicate compound represented by any of general formulae (1), (2), (3) and (4) below in an oxygen-containing atmosphere, wherein the oxygen-containing atmosphere is an atmosphere having an oxygen concentration of 100 vol %, or an atmosphere containing nitrogen or an inert gas and having an oxygen concentration of 1 vol % or higher but less than 100 vol %, wherein the single crystal of the cerium-doped silicate compound contains 0.00005 to 0.1 wt %, with respect to the total weight of the single crystal, of at least one elemental species selected from a group consisting of Mg, Ca, Sr, Ti, Zr, Hf, V, Nb, Ta, Cr, Mo and W, and wherein the single crystal is heated at a temperature of 700° C. to 1300° C. in the heating Step $$Y_{2-(x+y)}Ln_xCe_ySiO_5 \qquad (1)$$

(wherein Ln represents at least one elemental species selected from a group consisting of elements belonging to the rare earth elements, x represents a numerical value from 0 to 2, and y represents a numerical value greater than 0 but less than or equal to 0.2)

$$Gd_{2-(z+w)}Ln_zCe_wSiO_5 \qquad (2)$$

(wherein Ln represents at least one elemental species selected from a group consisting of elements belonging to the rare earth elements, z represents a numerical value greater than 0 but less than or equal to 2, and w represents a numerical value greater than 0 but less than or equal to 0.2)

$$Gd_{2-(p+q)}Ln_pCe_qSiO_5 \qquad (3)$$

(wherein Ln represents at least one elemental species selected from a group consisting of Dy, Ho, Er, Tm, Yb, Lu, Y and Sc, which are rare earth elements having an ionic radius smaller than Tb, p represents a numerical value greater than 0 but less than or equal to 2, and q represents a numerical value greater than 0 but less than or equal to 0.2)

$$Gd_{2-(r+s)}Lu_rCe_sSiO_5 \qquad (4)$$

(wherein r represents a numerical value greater than 0 but less than or equal to 2, and s represents a numerical value greater than 0 but less than or equal to 0.2).

6. The single crystal heat treatment method of any of claims 1 to 3, wherein the heating step comprises:
   a first step of heating the single crystal at a temperature of 300° C. to 1150° C. in the oxygen-containing atmosphere;
   a second step of, subsequent to the first step, converting the atmosphere to an oxygen-poor atmosphere while the heating temperature is maintained; and
   a third step of, subsequent to the second step, heating the single crystal at a temperature $T_a$ (units: ° C.), which is higher than the heating temperature and satisfies the conditions represented by formula (5) below, in the oxygen-poor atmosphere $$500 \leq T_a < (T_m - 550) \quad (5)$$

(wherein $T_m$ (units: ° C.) represents the melting point of the single crystal).

7. The single crystal heat treatment method of any of claims 1 to 3, wherein the heating step comprises:
   a fourth step of heating the single crystal at a heating temperature $T_b$ (units: ° C.) which satisfies the conditions represented by formula (6) below in an oxygen-poor atmosphere;
   a fifth step of, subsequent to the fourth step, converting the atmosphere to the oxygen-containing atmosphere; and
   a sixth step of, subsequent to the fifth step, heating the single crystal at a temperature of 300° C. to 1150° C. in the oxygen-containing atmosphere $$800 \leq T_b < (T_m - 550) \quad (6)$$

(wherein Tm (units: ° C.) represents the melting point of the single crystal).

8. The single crystal heat treatment method of claim 6, wherein the oxygen-poor atmosphere is an atmosphere containing a total concentration of argon and nitrogen gas of 80 vol % or higher, and an oxygen concentration of less than 0.2 vol %.

9. The single crystal heat treatment method of claim 7, wherein the oxygen-poor atmosphere is an atmosphere containing a total concentration of argon and nitrogen gas of 80 vol % or higher, and an oxygen concentration of less than 0.2 vol %.

10. The single crystal heat treatment method of claim 8, wherein the oxygen-poor atmosphere is an atmosphere containing hydrogen gas at a concentration of 0.5 vol % or more as a reducing gas.

11. The single crystal heat treatment method of claim 9, wherein the oxygen-poor atmosphere is an atmosphere containing hydrogen gas at a concentration of 0.5 vol % or more as a reducing gas.

12. The single crystal heat treatment method of any of claims 1 to 3, wherein prior to the heating step, the single crystal is grown or cooled in an oxygen-free, nitrogen or inert gas atmosphere, or a nitrogen or inert gas atmosphere containing a reducing gas; or is heated in an oxygen-free, nitrogen or inert gas atmosphere, or a nitrogen or inert gas atmosphere containing a reducing gas.

13. The single crystal heat treatment method of claim 2, wherein the heating temperature ranges from 700° C. to 1150° C.

14. The single crystal heat treatment method of claim 3, wherein the heating temperature ranges from 700° C. to 1150° C.

* * * * *